US006255145B1

(12) United States Patent
Ajmera et al.

(10) Patent No.: US 6,255,145 B1
(45) Date of Patent: Jul. 3, 2001

(54) PROCESS FOR MANUFACTURING PATTERNED SILICON-ON-INSULATOR LAYERS WITH SELF-ALIGNED TRENCHES AND RESULTING PRODUCT

(75) Inventors: Atul Ajmera, Wappinger; Devendra K. Sadana, Pleasantville; Dominic J. Schepis, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/227,696

(22) Filed: Jan. 8, 1999

(51) Int. Cl.[7] .......................... H01L 21/00; H01L 21/84; H01L 21/76; H01L 21/31; H01L 21/469

(52) U.S. Cl. .......................... 438/151; 438/149; 438/424; 438/761

(58) Field of Search .................................. 438/151, 424, 438/761, 149

(56) References Cited

U.S. PATENT DOCUMENTS

| 4,889,829 | 12/1989 | Kawai . | |
|---|---|---|---|
| 5,143,862 | 9/1992 | Moslehi . | |
| 5,364,800 | 11/1994 | Joyner . | |
| 5,399,507 | 3/1995 | Sun . | |
| 5,494,846 | * 2/1996 | Yamazaki | 437/62 |
| 5,548,149 | 8/1996 | Joyner . | |
| 5,612,246 | 3/1997 | Ahn . | |
| 5,643,822 | * 7/1997 | Furukawa | 437/67 |
| 5,646,053 | 7/1997 | Schepis et al. . | |
| 5,740,099 | 4/1998 | Tanigawa . | |
| 5,895,246 | * 2/1998 | Lee | 438/305 |
| 5,998,277 | * 3/1998 | Wu | 438/407 |
| 6,025,267 | * 7/1998 | Pey | 438/656 |
| 6,057,214 | * 12/1997 | Joyner | 438/506 |

* cited by examiner

Primary Examiner—Charles Bowers
Assistant Examiner—Nema Berezny
(74) Attorney, Agent, or Firm—Ratner & Prestia; Joseph P. Abate, Esq.

(57) ABSTRACT

A process for forming a planar silicon-on-insulator (SOI) substrate comprising a patterned SOI region and a bulk region, wherein the substrate is free of transitional defects. The process comprises removing the transitional defects by creating a self-aligned trench adjacent the SOI region between the SOI region and the bulk region.

20 Claims, 2 Drawing Sheets

PROCESS FOR MANUFACTURING PATTERNED SILICON-ON-INSULATOR LAYERS WITH SELF-ALIGNED TRENCHES AND RESULTING PRODUCT

TECHNICAL FIELD

The present invention relates to a process of fabricating a semiconductor device, and more particularly, to a process of forming patterned SOI layers with self-aligned trenches.

BACKGROUND OF THE INVENTION

Silicon-on-insulator (SOI) structures comprise a buried insulating layer which electrically isolates a silicon layer from a silicon substrate. The SOI structure does not always occupy the entire surface of a silicon substrate; rather, the SOI structure sometimes occupies only a portion of the silicon substrate. The area assigned to the SOI structure is commonly referred to as the SOI region and the area outside the SOI structure is commonly referred to as the bulk region.

A semiconductor device having a bulk region and an SOI region has the advantages of excellent crystallization of the bulk region and excellent element insulation of the SOI region. For example, logic memory circuits are preferably formed in bulk element regions while high performance logic circuits are preferably formed in the SOI region. It is desirable, therefore, for a semiconductor device to have areas of SOI and bulk silicon adjacent on the same wafer.

Numerous techniques have been developed to form SOI and bulk regions. One of the most manufacturable techniques is ion implantation which involves the implantation of high energy ions into a solid surface to form a buried layer. Because the implanted dopants are generally not in the proper lattice position and are mostly inactive, a high temperature annealing process is often used to repair crystal damage and electrically activate the dopants. Implantation of oxygen into silicon is generally a preferred process for building SOI substrates. The separation by implanted oxygen (SIMOX) process can be used, for example, in very large scale integration (VLSI) devices.

Unfortunately, masked or patterned ion implantation produces a region of partial implantation, referred to as the transition region, in the semiconductor substrate. The transition region forms between the area that receives the full ion implant dose and the region that was shielded from implantation, known as the mask region. As a result of this partial dose, the transition region is highly defective, containing crystal defects that may propagate to other regions of the semiconductor silicon layer.

U.S. Pat. No. 5,740,099 issued to Tanigawa teaches building areas of SOI and bulk silicon wafers on a substrate and building different types of circuits in each area. Tanigawa discusses the concept of making multiple regions of SOI and bulk, on the same wafer, using a patterned ion implant. This method is known to cause defects at all of the patterned edge regions. Tanigawa fails to address this defect region and presumably just spaces the devices so that no transistor falls within the transition defect region.

U.S. Pat. No. 5,612,246 issued to Ahn describes a method and structure in which standard SIMOX SOI wafers are patterned and then the silicon and buried oxide are etched down to the bulk silicon substrate. Ahn then builds devices on the bulk silicon substrate. One problem with this method is that the structure is non-planar and, therefore, the levels or heights of the bulk and SOI devices are different on the wafer. Consequently, every film that is deposited and etched will leave a side wall or rail around the step between the two levels of silicon.

U.S. Pat. No. 5,364,800 and U.S. Pat. No. 5,548,149, both issued to Joyner, teach a technique using masking oxide of various thickness to produce a buried oxide layer of differing depths. At the extreme ends of the ranges of the mask thickness, Joyner can create thick SOI, thin SOI, or bulk silicon regions. Thus, Joyner can create a substrate with both SOI and bulk regions. Although he uses a patterned implant to form SOI and bulk regions, Joyner does not in any way address the transition region where the buried implant ends and the bulk silicon begins.

U.S. Pat. No. 4,889,829 issued to Kawai describes a method of making bulk and SOI regions on the same substrate. Kawai builds the bulk in the original substrate and then deposits, using chemical vapor deposition or CVD, an oxide on top to form the buried oxide. Silicon (polysilicon) is then deposited on top of the oxide. Because high-quality devices cannot be built on polysilicon, Kawai then recrystallizes the poly with a laser to form a single crystal. SOI devices are then built on this layer. The final structure is non-planar, as is the structure taught by Ahn, with the inherent problems of such a structure. In addition, the process described by Kawai is impractical because control over recrystallization of the poly is poor.

U.S. Pat. No. 5,143,862 issued to Moslehi teaches SOI wafer fabrication by selective epitaxial growth. Moslehi etches wide trenches, deposits a buried oxide by CVD, removes the oxide from the side walls of the trench, then uses selective epitaxial growth to grow the silicon over the oxide region. Moslehi then isolates the region by forming side walls on the epitaxial mask, continues to grow the silicon to the surface, and, finally, removes the side walls and etches a trench filled with dielectric to isolate devices. The method does not remove the damage regions in the transition phase. In fact, the trench does not extend past the buried oxide layer.

Japanese Patent No. 06334147 issued to Hitachi Ltd. teaches dividing a substrate into areas of SOI and bulk and placing different circuit types in each region to obtain specific advantages for each region. Because stacked capacitors are raised above the bulk silicon surface, SOI regions are created that are raised such that the final chip is planar with respect to all regions. It appears that the top silicon and buried oxide are removed from the SOI structure to leave bulk substrate regions for memory cells. Thus, the structure is a mixed substrate with memory on bulk and SOI for logic and an approximately planar surface.

U.S. Pat. No. 5,399,507 issued to Sun also describes a method and structure for forming bulk and SOI regions on a single substrate. The method starts with blanket SOI (formed by SIMOX) and then etches away the silicon and buried substrate layer down to the silicon substrate. At this step of the method, the structure is similar to the structure disclosed by Ahn in that the structure has an exposed bulk silicon region at a different level than the top of the SOI region. Sun goes further, however, and places a side wall on the etched opening then uses selective epitaxial growth on the silicon which is a continuation of the single crystal silicon. The epitaxial growth continues up to the surface of the SOI region so that the region is planar. Sun may also use a planarizing step to ensure that the two regions are on the same plane. Sun fails either to improve the patterned implants or to remove any defect regions which may exist. The patterned SOI implant taught by Sun in an alternate embodiment does not have any isolation, nor does Sun indicate that any isolation is necessary. Moreover, there is no way to self-align an isolation with the mask structure.

The deficiencies of the ion implantation processes of building SOI substrates show that a need still exists for eliminating the highly defective transition area that receives a partial dose of ion implant. To overcome the shortcomings of ion implantation processes, a new process is provided. An object of the present invention is to provide a process of forming patterned SOI layers without forming a highly defective transition region.

SUMMARY OF THE INVENTION

To achieve these and other objects, and in view of its purposes, the present invention provides a process for forming a planar SOI substrate comprising a patterned SOI region and a bulk region, in which the substrate is free of transitional defects. The process comprises removing the transitional defects by creating a self-aligned trench adjacent the SOI region between the SOI region and the bulk region.

The self alignment of the trench is obtained by forming buried silicon oxide regions in a silicon substrate having a silicon oxide surface layer and a surface protective layer comprising silicon nitride or polysilicon, over the silicon oxide surface layer, by:

(a) forming over the surface protective layer a mask area, having a mask area top surface and side walls, to mask a portion of the substrate other than the regions of the buried silicon oxide;

(b) depositing a side wall cover layer selected from the group consisting essentially of silicon nitride and silicon oxide-silicon nitride composite on the mask area side walls, the side wall cover layer also extending over a portion of the surface protective layer;

(c) removing the surface protective layer not under the mask layer and the side wall cover layer to expose portions of the silicon oxide surface layer;

(d) implanting oxygen ions in the silicon substrate areas under the exposed portions of the silicon oxide surface layer to form a buried oxide layer having a top surface;

(e) annealing the exposed portion of the silicon oxide surface layer to form a thick surface silicon oxide area and annealing the buried oxide layer;

(f) removing the side wall cover layer and the surface protective layer under the side wall cover layer to expose the substrate;

(g) forming a trench in the exposed portion of the substrate extending between the mask side walls and the thick surface silicon oxide layer and extending in the substrate to at least the top surface of the buried oxide layer;

(h) removing the mask layer; and (i) filling the trench with a fill material.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The invention will next be illustrated with reference to the figures in which similar numbers indicate the same elements in all figures. Such figures are intended to be illustrative, rather than limiting, and are included to facilitate the explanation of the process of the present invention.

Figure 1:
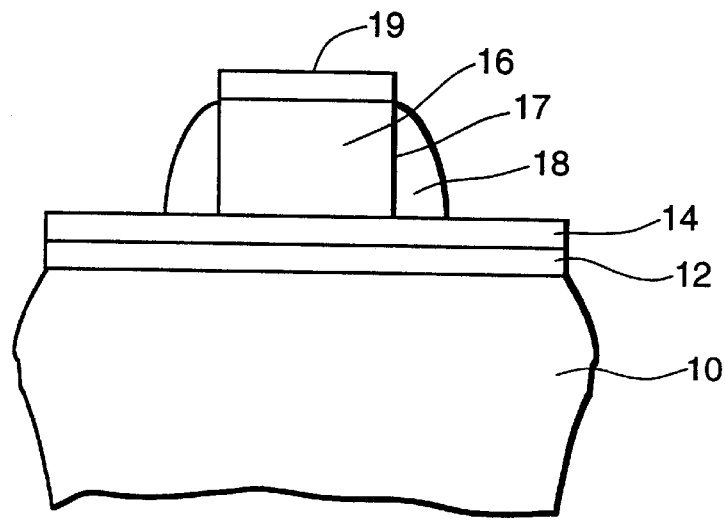
FIG. 1 shows in schematic representation an element comprised of a silicon substrate, a surface silicon oxide layer, and a surface protective layer, with the substrate having a mask layer, a protective layer, and a side wall cover layer deposited on the substrate.

Beginning with FIG. 1, the first step in implementing the process of the present invention involves obtaining a silicon substrate 10 having a surface silicon oxide layer 12 covered by a surface protective layer 14. Surface protective layer 14 is usually a layer of silicon nitride or polysilicon. The formation of such layers on the silicon substrate represent well known technology and are not critical to the present invention.

As shown in FIG. 1, there is first deposited over the surface protective layer 14 a mask 16. This mask 16 is typically deposited as a continuous layer over the surface protective layer 14 and is then patterned and etched to form individual masks delineating the eventual bulk areas in the completed element. In a preferred embodiment, mask 16 comprises tetraethoxysilane (TEOS). A silicon nitride layer can optionally be deposited on the exposed top surface of the mask 16, forming a mask protective silicon nitride layer 19.

The mask 16 has exposed side walls 17 which are next covered with a side wall cover layer 18. Side wall cover layer 18 preferably comprises silicon nitride or a composite of silicon oxide and silicon nitride. It is preferred that the side wall cover layer 18 and the mask protective layer 19 be of the same material. The side wall cover layer 18 may be formed by depositing a silicon nitride or silicon oxide-silicon nitride layer to fill the space between adjacent masks 16 and then patterning and etching the deposited layer to create the side wall cover layer 18 on the side walls 17 of the mask 16.

Figure 2:
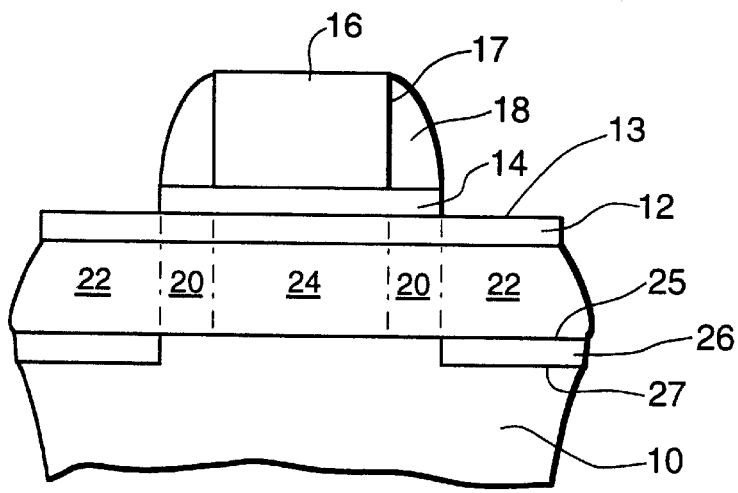
FIG. 2 shows in schematic representation the element of FIG. 1 after the protective layer has been removed, the surface protective layer has been partially removed, and a buried oxide layer has been formed.

In a preferred embodiment, the thickness of surface silicon oxide layer 12 is from about 50 Å to about 200 Å, the thickness of surface protective layer 14 is from about 500 Å to about 1500 Å, and the thickness of mask 16 is from about 500 Å to about 5000 Å. Mask side wall cover layer 18 has a tapered shape with varying thickness, as shown in FIG. 2. Measuring thickness along the bottom portion of mask side wall cover layer 18 adjacent surface protective layer 14, the thickness of mask side wall cover layer 18 is preferably from about 1,200 Å to about 2,500 Å when composed of silicon nitride and from about 1,000 Å to about 2,500 Å when composed of a silicon oxide-silicon nitride composite.

The next step in the process of the present invention involves removing the portion of the exposed surface protective layer 14 that does not lie under the mask 16 and the mask side wall cover layer 18. The structure which exists following this step is illustrated in FIG. 2. As shown in this figure, removal of the exposed portion of surface protective layer 14 adjacent side wall cover layer 18 exposes a portion 13 of the underlying surface silicon oxide layer 12.

Following this step, oxygen ions are implanted into the exposed portion 13 of surface silicon oxide layer 12. The mask 16 and the mask side wall cover layer 18 shield ion implantation into the region of surface silicon oxide layer 12 and silicon substrate 10 below mask 16 and mask side wall cover layer 18. Ion implantation is a process in which energetic, charged atoms or molecules are directly introduced into a substrate, such as a silicon substrate. Preferably, about $1\times10^{18}/cm^2$ oxygen ions are implanted at about 200 keV.

The step of ion implantation produces a transition region 20 between the area that receives the full ion dose 22 and the area that that does not receive any ion dose 24 (the portion of surface silicon oxide layer 12 and silicon substrate 10 shielded by mask layer 16 and mask side wall cover layer 18). A buried oxide layer 26, having a top surface 25 and a bottom surface 27, is formed within the area that received the full ion dose 22.

In a preferred embodiment, buried oxide layer 26 and surface silicon oxide layer 12 are annealed following the step of ion implantation. Alternatively, the step of annealing buried oxide layer 26 and surface silicon oxide layer 12 occurs after the subsequent steps, to be described below, of removing the side wall cover layer 18 and mask 16, and removing the exposed portion 13 of the surface protective layer 14, and before the step of filling the trench. In a preferred embodiment, the thickness of the buried oxide layer 26 is at least about 50 Å.

Figure 3:
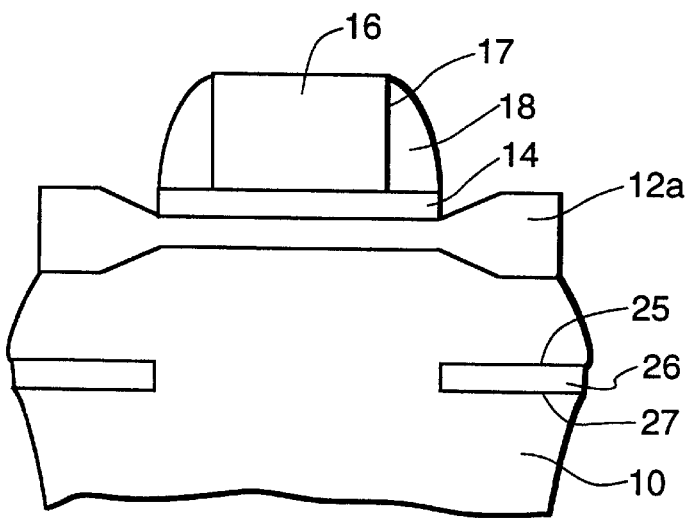
FIG. 3 shows in schematic representation the element of FIG. 2 after a portion of the surface silicon oxide layer and the buried oxide layer have been annealed.

The buried oxide layer 26 is next annealed. Also following ion implantation, the surface silicon oxide layer 12 is annealed to form a thick surface silicon oxide area 12a, as shown in FIG. 3. The desired thickness of thick surface silicon oxide layer 12a is from about 1,000 Å to about 3,000 Å. If, after the annealing step to form thick surface silicon oxide area 12a, the desired thickness of thick surface silicon oxide area 12a has not been reached, thick surface silicon oxide area 12a can optionally be thermally oxidized with dry oxygen at a temperature of about 1000° C. to increase its thickness.

Figure 4:
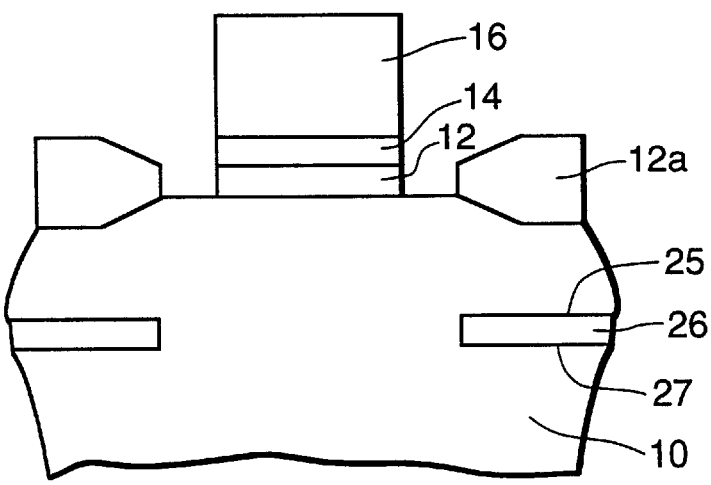
FIG. 4 shows in schematic representation the element of FIG. 3 after the side wall cover layer and portions of the surface silicon oxide layer and portions of the surface protective layer have been removed.

The annealing and optional oxidizing steps are followed by the removal of the side wall cover layer 18, the underlying surface protective layer 14, and the surface silicon oxide layer 12 between the mask 16 and the thick surface silicon oxide layer 12a as shown in FIG. 4. Removal of the side wall cover layer 18 and underlying surface protective layer 14 is, preferably, done by dry etching. It is in this space between the mask side walls 17 and the thick surface silicon oxide layer 18 that the trenches according to the present invention are formed.

Figure 5:
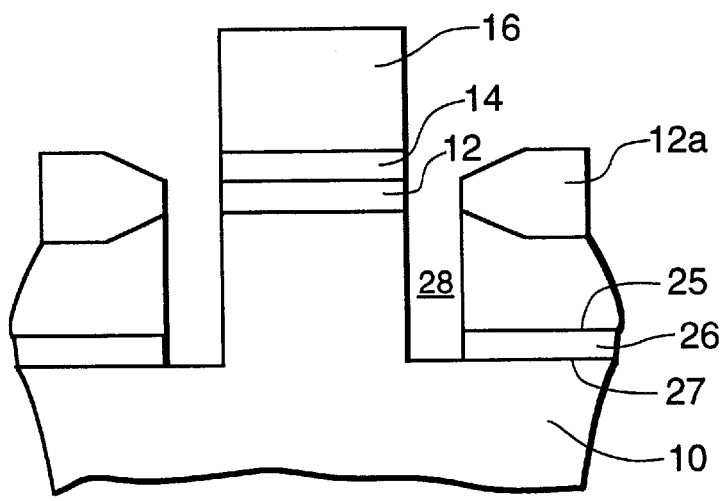
FIG. 5 shows in schematic representation the element of FIG. 4 following the formation of trenches.

FIG. 5 shows a side view of the element in which self-aligned trenches 28 have been formed. The trenches 28 self-align in the transition region 20 between thick surface silicon oxide area 12a and mask side wall 17. The trenches 28 are formed using etching techniques, and extend in the silicon substrate to at least the top surface 25 of buried oxide layer 26. In a preferred embodiment, the trenches 28 extend to about the bottom surface 27 of buried oxide layer 26, as illustrated in FIG. 5. Thus, the etched trenches 28 remove transition region 20, which has not received a full ion implant. In a preferred embodiment, the trenches 28 are etched using dry etching techniques such as reactive ion etching (RIE) or plasma enhanced etching.

Figure 6:
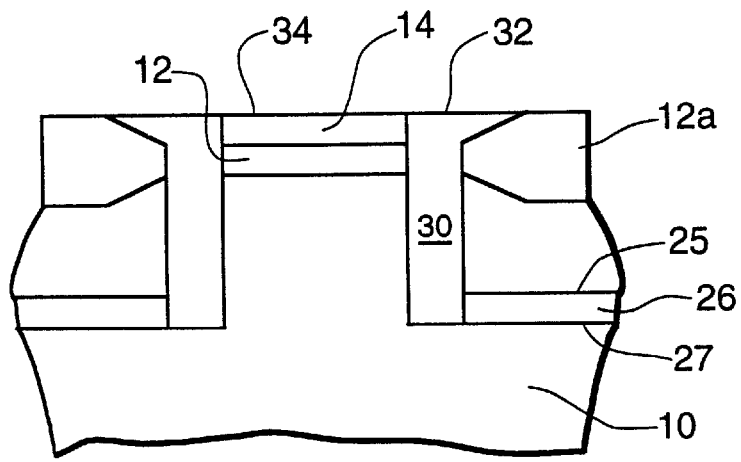
FIG. 6 shows in schematic representation the element of FIG. 5 after the mask layer has been removed, the trenches have been filled, and the element has been planarized.

Once the trenches 28 have been formed, they are next filled to at least the exposed portion 34 of surface protective layer 14 with a fill material 30, and the element is planarized following removal of the mask 16, as shown in FIG. 6. In a preferred embodiment, fill material 30 is an oxide, such as tetraethoxysilane (TEOS). Following trench filling, surface 32 of the filled trench, exposed portion 13 of surface silicon oxide layer 12, and exposed portion 34 of surface protective layer 14 are planarized, using surface protective layer 14 as a stop. In a preferred embodiment, planarization is done by chemical-mechanical polishing (CMP) processing.

Following planarization, steps known in the art to complete regular STI (shallow trench isolation) processes can be applied. In addition, the steps of the process of the present invention can be used in bulk STI processes.

The following example is included to more clearly demonstrate the overall nature of the invention. This example is exemplary, not restrictive, of the invention.

EXAMPLE 1

A surface silicon oxide layer 12 was deposited on a <100>silicon substrate 10. A silicon nitride layer (surface protective layer 14) was then deposited on the surface silicon oxide layer 12. A 5,000 Å TEOS layer was deposited on the surface protective layer 14. The TEOS layer was patterned using conventional photolithography and etched forming a TEOS mask 16. A silicon nitride layer 19 was deposited on the side walls 17 of the TEOS mask 16 and etched forming a side wall cover layer 18. The portion of the surface protective layer 14 not underlying the mask 16 and the side wall cover layer 18 was removed using photolithography and etching, exposing a portion 13 of the surface silicon oxide layer 12.

A SIMOX oxygen implant was performed, implanting oxygen ions into areas not protected by the TEOS mask 16 and side wall cover layer 18 and forming a buried oxide layer 26. The buried oxide layer 26 and exposed portion 13 of the surface silicon oxide layer 12 were then annealed; annealing the exposed portion 13 of the surface silicon oxide layer 12 formed a thick surface silicon oxide area 12a. Next, the thick surface silicon oxide area 12a was thermally oxidized, thickening the thick surface silicon oxide area 12a to about 2,000 Å. The side wall cover layer 18 was then removed by hot phosphoric etching followed by a short buffered hydrofluoric (BHF) dip to remove pad oxide from the TEOS side wall region, leaving an unprotected area between the mask 16 and the thick surface silicon oxide area 12a.

A trench 28 was next etched in the transition region 20, to a depth adjacent the bottom surface 27 of the buried silicon oxide layer 26, aligning between the thick surface silicon oxide area 12a and the TEOS mask 16. The mask 16 was next removed, a BHF strip was used to remove mask oxide from the trench 28, and then a trench reoxidation was performed. The trench 28 was filled with TEOS by a chemical vapor deposition (CVD) process. Chemical-mechanical polishing (CMP) processes were then used to planarize the final structure using the remaining nitride as an etch stop.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A process for forming a planar silicon-on-insulator (SOI) substrate comprising a patterned SOI region having an oxide layer and a bulk region, wherein the substrate is free of transitional defects, the process comprising removing the transitional defects by creating a self-aligned trench adjacent the SOI region between the SOI region and the bulk region.

2. The process of claim 1 wherein the bulk region comprises a mask having side walls.

3. The process of claim 2 wherein the mask has a thickness of from about 500 Å to about 5,000 Å.

4. The process of claim 3 wherein the trench is formed adjacent the oxide layer of the SOI region and adjacent the mask of the bulk region.

5. The process of claim 4 further comprising a step of depositing side wall cover layers on the mask side walls before forming the trench.

6. The process of claim 5 further comprising a step of implanting oxygen ions into the SOI region, forming a buried oxide layer, wherein the mask and side wall cover layer shield ion implantation into the bulk region.

7. The process of claim 6 further comprising a step of removing the side wall cover layer after implanting oxygen ions and before forming the trench.

8. The process of claim 7 wherein the buried oxide layer has a thickness of at least about 50 Å.

9. A process for forming buried silicon oxide regions in a silicon substrate having a silicon oxide surface layer and a surface protective layer comprising silicon nitride or polysilicon, over said silicon oxide surface layer, the process comprising the steps of:

(a) forming over said surface protective layer a mask, having a top surface and side walls, to mask a portion of the substrate other than the regions of the buried silicon oxide;

(b) depositing a side wall cover layer selected from the group consisting essentially of silicon nitride and silicon oxide-silicon nitride composite on the mask side walls, said side wall cover layer also extending over a portion of the surface protective layer;

(c) removing the surface protective layer not under the mask and the side wall cover layer to expose portions of the silicon oxide surface layer;

(d) implanting oxygen ions in the silicon substrate areas under the exposed portions of the silicon oxide surface layer to form a buried oxide layer having a top surface and a bottom surface;

(e) annealing the exposed portion of the silicon oxide surface layer to form a thick surface silicon oxide area and annealing the buried oxide layer;

(f) removing the side wall cover layer and the surface protective layer under the side wall cover layer to expose a portion of the substrate;

(g) forming a trench in the exposed portion of the substrate extending between the mask side wals and the thick surface silicon oxide layer and extending in said substrate to at least the top surface of the buried oxide layer;

(h) removing the mask; and (i) filling the trench with a fill material.

10. The process of claim 9 wherein the step of annealing the buried oxide layer is performed after forming the trench.

11. The process of claim 9 wherein the mask is tetra-ethoxysilane.

12. The process of claim 11 wherein the mask is from about 500 Å to about 1,000 Å thick.

13. The process of claim 9 wherein a silicon nitride layer is deposited on the top surface of the mask before step (b).

14. The process of claim 9 wherein the surface silicon oxide layer is from about 50 Å to about 200 Å thick.

15. The process of claim 9 wherein the surface protective layer is from about 500 Å to about 1,500 Å thick.

16. The process of claim 9 wherein the side wall cover layer is from about 1,200 Å to about 2,500 Å thick.

17. The process of claim 9 wherein the implantation step comprises implanting about $1 \times 10^{18}/cm^2$ oxygen ions at about 200 keV.

18. The process of claim 9 wherein the thick surface silicon oxide area is from about 500 Å to about 3,000 Å thick.

19. The process of claim 9 further comprising the step of thermally oxidizing the exposed portion of the surface silicon oxide layer after step (e).

20. The process of claim 9 wherein the trench formed in step (g) extends to about the bottom surface of the buried oxide layer.

* * * * *